US011152077B2

(12) United States Patent
Hamor et al.

(10) Patent No.: US 11,152,077 B2
(45) Date of Patent: Oct. 19, 2021

(54) TRANSMITTING DATA AND POWER TO A MEMORY SUB-SYSTEM FOR MEMORY DEVICE TESTING

(71) Applicant: MICRON TECHNOLOGY, INC., Boise, ID (US)

(72) Inventors: Gary D. Hamor, Mead, CO (US); Michael T. Brady, Loveland, CO (US); William A. Marcus, Frederick, CO (US); Larry J. Koudele, Erie, CO (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/719,698

(22) Filed: Dec. 18, 2019

(65) Prior Publication Data

US 2021/0193249 A1   Jun. 24, 2021

(51) Int. Cl.
| | |
|---|---|
| *G11C 29/44* | (2006.01) |
| *G11C 29/32* | (2006.01) |
| *G11C 29/02* | (2006.01) |
| *G06F 11/30* | (2006.01) |
| *G11C 29/56* | (2006.01) |

(52) U.S. Cl.
CPC .......... *G11C 29/44* (2013.01); *G06F 11/3037* (2013.01); *G06F 11/3062* (2013.01); *G11C 29/022* (2013.01); *G11C 29/32* (2013.01); *G11C 29/56* (2013.01); *G11C 2029/5602* (2013.01)

(58) Field of Classification Search
CPC ....... G11C 29/44; G11C 29/022; G11C 29/56; G11C 29/32; G11C 2029/5602; G06F 11/3062; G06F 11/3037
USPC ....................................................... 365/201
See application file for complete search history.

(56) References Cited

U.S. PATENT DOCUMENTS

| | | | |
|---|---|---|---|
| 2008/0201622 A1* | 8/2008 | Hiew ..................... | G11C 29/56 714/718 |
| 2012/0041707 A1* | 2/2012 | Hsu ..................... | G06F 11/2284 702/119 |
| 2019/0139899 A1* | 5/2019 | Jung ................... | H01L 23/5386 |

\* cited by examiner

*Primary Examiner* — Fernando Hidalgo
(74) *Attorney, Agent, or Firm* — Lowenstein Sandler LLP

(57) ABSTRACT

A processing device of a memory device test resource detects that a memory sub-system has engaged with a first memory sub-system interface port and a second memory sub-system interface port of the memory device test resource. The processing device causes a power supply signal to be transmitted from the memory device test resource to the memory sub-system via the first memory sub-system interface port. The processing device identifies a test to be performed for a memory device of the memory sub-system, where the test includes one or more test instructions to be executed in performance of the test. The processing device causes the one or more test instructions to be transmitted from the memory device test resource to the memory sub-system via the second memory sub-system interface port, where the test is performed by the one or more test instructions executing at the memory sub-system.

19 Claims, 7 Drawing Sheets

TRANSMITTING DATA AND POWER TO A MEMORY SUB-SYSTEM FOR MEMORY DEVICE TESTING

TECHNICAL FIELD

Embodiments of the disclosure relate generally to memory sub-systems, and more specifically, relate to transmitting data and power to a memory sub-system for memory sub-system testing.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
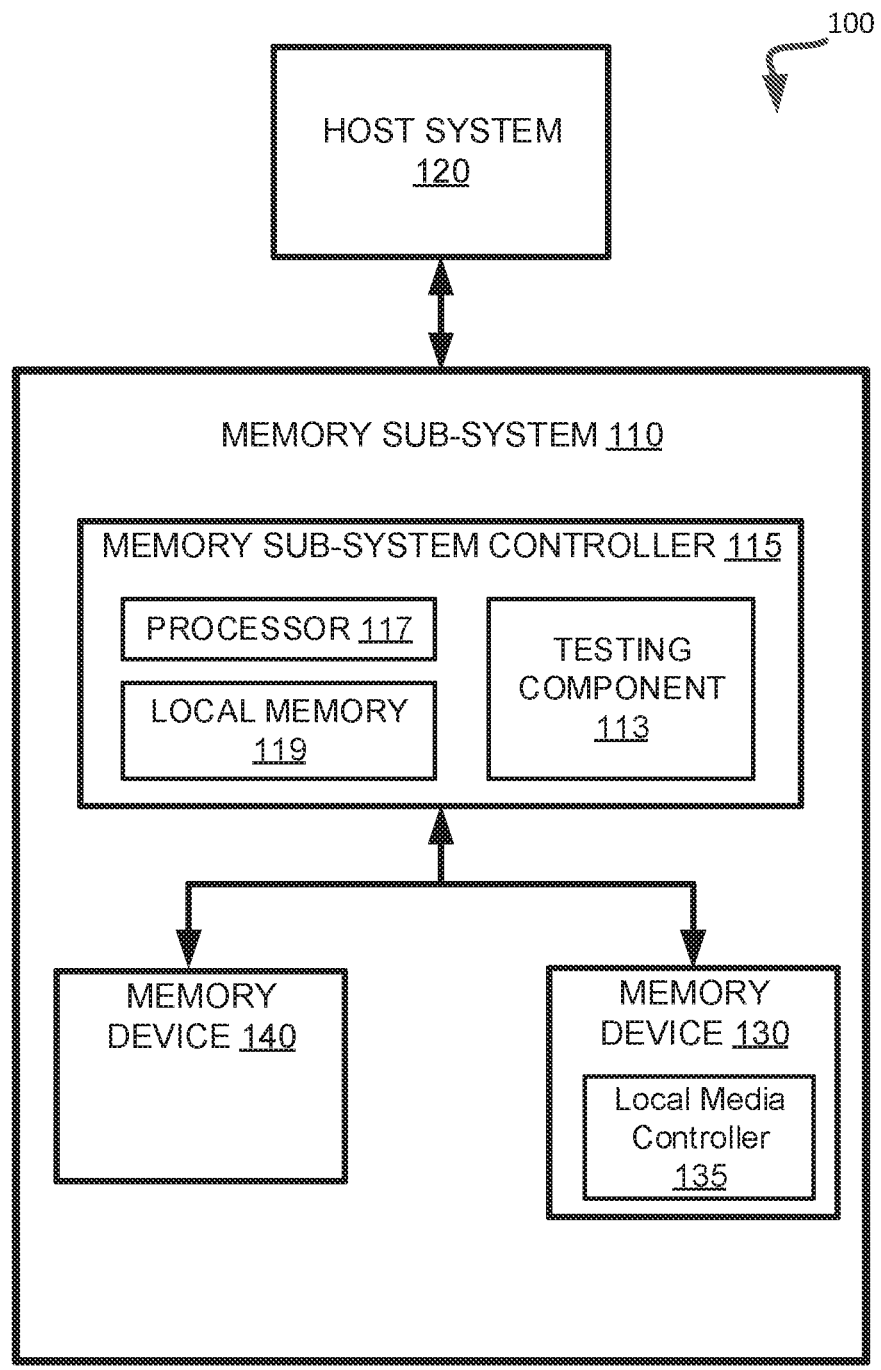
FIG. 1 illustrates an example computing system that includes a memory sub-system, in accordance with some embodiments of the present disclosure.

Aspects of the present disclosure are directed to transmitting data and power to a memory sub-system for memory sub-system testing. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system.

Memory devices that are used in a memory sub-system can be tested before being utilized in the memory sub-system. In a conventional test process, the memory devices can be placed into a chamber (i.e., an oven) that tests the memory device under various temperature conditions. For example, a single chamber can be used to test multiple memory devices at a single time at a particular temperature. The test process can instruct various operations to be performed at the memory devices at the particular temperature. Such operations include, but are not limited to, read operations, write operations, and/or erase operations. The performance and behavior of the memory devices can be observed while the test process is performed. For example, performance characteristics (e.g., read or write latencies) and reliability of data stored at the memory devices can be measured and recorded during and after the test process. However, since the chamber can only subject the memory devices to a single temperature at any particular time, the testing of the memory devices at many different temperatures can require a large amount of time as the test process will need to be performed for each target test temperature. Additionally, the chamber can only perform a single test process at a time. As such, performing different tests of the memory devices at different operating conditions (e.g., different temperatures) can utilize a large amount of time if many different conditions of the test process for the memory devices to be tested.

In some conventional memory device testing systems, memory devices can be tested using a testing component that includes a temperature control component. The temperature control component is used to subject the memory device to a particular temperature condition. In some testing components, only a temperature control component is included and the memory device is not subjected to any other conditions during memory device testing. Multiple testing components can be included in a testing rack, where each testing component of the testing rack is coupled to a local testing module. The local testing module can facilitate testing for each memory sub-system coupled to a testing component of the testing rack. For example, the local testing module cause various operations to be performed for memory devices at multiple testing components at one or more temperature conditions.

The testing components can include a customer interface port to facilitate connection between the memory device and the local testing module. A customer interface port is an input/output (IO) port that a customer can use to facilitate a connection between the memory device and a customer device. The testing component can transmit power from the testing component and memory device via the customer interface port during testing. The testing component can also transmit instructions to perform various test operations from the local testing module to the memory device via the customer interface port. Performance data resulting from the performance of the test can be transmitted from the memory device to the local testing module via the customer interface port. Multiple signals can pass through the customer interface port for each instruction or data that is transmitted between the memory device and the local testing module. Each signal that passes through the customer interface port can increase the latency of the overall testing system. Further, each signal can have strict timing requirements that are coordinated by the local testing module, thereby further increasing latency of the overall testing system.

Aspects of the present disclosure address the above and other deficiencies by having a memory device test resource that transmits data and power to a memory device for memory device testing. A distributed test platform can include multiple memory device test resources. Each test resource includes a processing device, one or more test condition components, one or more test resource monitoring components, a first memory sub-system interface port and a second memory sub-system interface port. A memory sub-system, including a memory device to be tested, can be coupled to a test resource by engaging with the first memory sub-system interface port and the second memory sub-system interface port. In some embodiments, the first memory sub-system interface port can be a non-serial input/output (IO) port, such as a customer interface port, and the second memory sub-system interface port can be a serial IO port. In response to detecting the memory sub-system is coupled to the test resource, the processing device can transmit a power supply signal, such as electricity, to memory sub-system via the first memory sub-system interface port. The processing device can transmit test instructions including one or more operations to be performed at the memory device via the second memory sub-system interface port. A memory sub-system controller of the memory sub-system can cause the one or more operations to be performed at the memory device. The memory sub-system controller can generate a set of test results for the performance of each operation at the memory device. After the operations are performed at the memory sub-system, the memory sub-system controller transmits the set of test results to the processing device via the second memory sub-system interface port.

Each test resource includes a test condition component. A test condition component can include at least one of a temperature controller or a voltage controller. A temperature controller is configured to control a temperature of the memory device during testing. The voltage controller is configured to control a voltage of the power supply signal provided to the memory sub-system via the first memory sub-system interface port. At least one of the temperature controller or the voltage controller can cause a first condition to occur prior to the initiation of testing at the memory device. During testing of the memory device, the temperature controller and/or the voltage controller can cause a second condition to occur. In response to detecting that the second condition has occurred, the memory sub-system controller can generate a second set of test results, where the second set of test results are related to the performance of an operation performed at the memory device operating at the second condition.

Advantages of the present disclosure include, but are not limited to, a decrease in an amount of time that the test platform is utilized to perform test of the memory devices. As many different tests can be performed at the test platform to test many different conditions (e.g., different temperatures, different power supply signal voltages, etc.) during the performance of many different sequences of operations, the testing of memory devices can be considered to be more robust as the reliability and performance of the memory devices can be tested by performing many different and concurrent tests. Further, by transmitting the set of test instruction for the test to be performed at the memory device via the serial IO interface port rather than the non-serial IO port, the number of total signals transferred between the test resource and the memory sub-system decreases. Further, signal scheduling is not performed in transmitting the signals over the serial IO port. As such, each test for each memory device can be performed in less time, thereby decreasing overall system latency. As such, the reliability of the memory device can also be increased as any potential defects of flaws can be identified and later addressed in the design or manufacturing of the memory devices that are to be available to customers.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a testing component 113 which performs tests on a memory device of sub-system 110, such as memory device 130. Memory sub-system 110 can couple to a memory device test resource, such as memory device test resource 310 of FIG. 3. Testing component 113 receives, from a processing device of the test resource, one or more instructions for a test to be performed at memory device 130. The test instructions can include one or more operations to be performed at memory device 130, such as read operations, write operations and/or erase operations. Testing component 113 causes the performance of the one or more operations at memory device 130. During the performance of the one or more operations, testing component 113 collects data relating to the performance of the one or more operations. Testing component 113 generates a first set of test results based on the data collected during the performance of the one or more operations. The first set of test results can include data corresponding to the performance of the one or more operations at memory device 130. The first set of test results can further include data corresponding to the health of the memory device 130 (e.g., an endurance of the memory device, a data retention of the memory device, etc.)

In some embodiments, testing component 113 detects one or more conditions of memory sub-system 110 have changed during a performance of the one or more operations at memory device 130. For example, a temperature of memory sub-system 110 can increase from a first temperature to a second temperature during performance of the one or more operations. In some embodiments, a test condition component of the test resource can change the one or more conditions of memory sub-system 110. In such embodiments, testing component 113 generates a second set of test results based on the data collected during the performance of the one or more operations performed at the second condition. After testing component 113 generates the first set of test results and/or the second test of test results, testing component 113 transmits each set of test results to a test resource.

Figure 2:
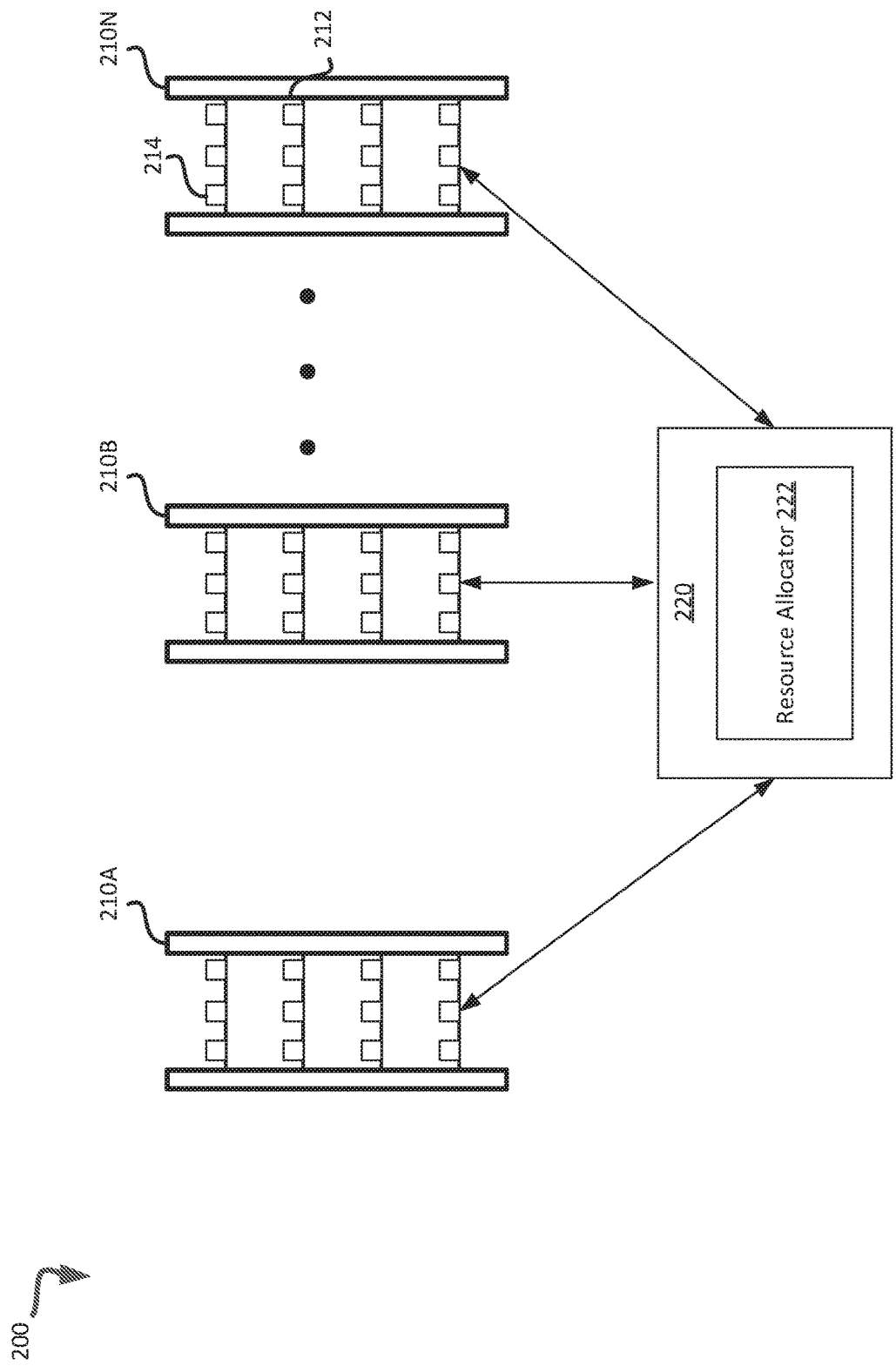
FIG. 2 is a test platform to perform a test of memory devices, in accordance with some embodiments of the present disclosure.

FIG. 2 illustrates a test platform 200 to perform a test of memory devices in accordance with some embodiments of the present disclosure. Test platform 200 can include one or more racks 210A, 210B, and 210N. Each of the racks 210A, 210B, and 210N can include multiple test boards 212 where each test board 212 includes one or more test resources 214 (i.e., test sockets). The test platform 200 can include any number of racks or test resources.

As shown, a test board 212 can include one or more test resources 214. Although three test resources 214 are shown, a test board 212 can include any number of test resources 214. Each test resource can include a memory sub-system that has been embedded within the respective test resource.

One or more tests can be performed for a memory device of a memory sub-system that has been embedded with a test resource. Each test resource 214 can include a separate and dedicated processing device that is used to facilitate testing of the memory device. For example, rather than there being a shared processing device for each rack 210 or even for each test board 212, there can be an individual processing device for each test resource 214. The processing device can receive instructions to be executed in performance of the test. The instructions can include one or more operations to be performed at a memory device of the embedded memory sub-system. The instructions can also include one or more conditions to be applied to the memory sub-system during testing.

A resource allocator component 222 can receive (e.g., from a user) instructions including a sequence of one or more operations and/or conditions of the test that is to be performed for a memory device of a memory sub-system. The resource allocator component 222 can determine particular test resources 214 across the different test racks 210 that can be used to perform the test. In some embodiments, the resource allocator component 222 can be provided by a server 220 connected to each of the test resources 214. In some embodiments, the server 220 is a computing device or system that is coupled with each processing device of each test resource 214 over a network.

In response to a memory sub-system being coupled to a particular test resource 214, resource allocator component 222 can transmit the received instructions to the processing device of the particular test resource 214. In some embodiments, the resource allocator component 222 can transmit the received instructions to the processing device of the particular test resource 214 prior to the memory sub-system being coupled to the test resource 214. After the test has been performed for the memory device of the embedded memory sub-system, the processing device of the test resource 214 can transmit data associated with the results of the test to the resource allocator component 222, for transmission and/or presentation to the requesting user. The data associated with the results of the test can include data associated with the performance of the operations at the memory device of the memory sub-system. In some embodiments, the data associated with the results of the test can further include data associated with one or more conditions of the test resource 214 during the performance of the test.

Figure 3:
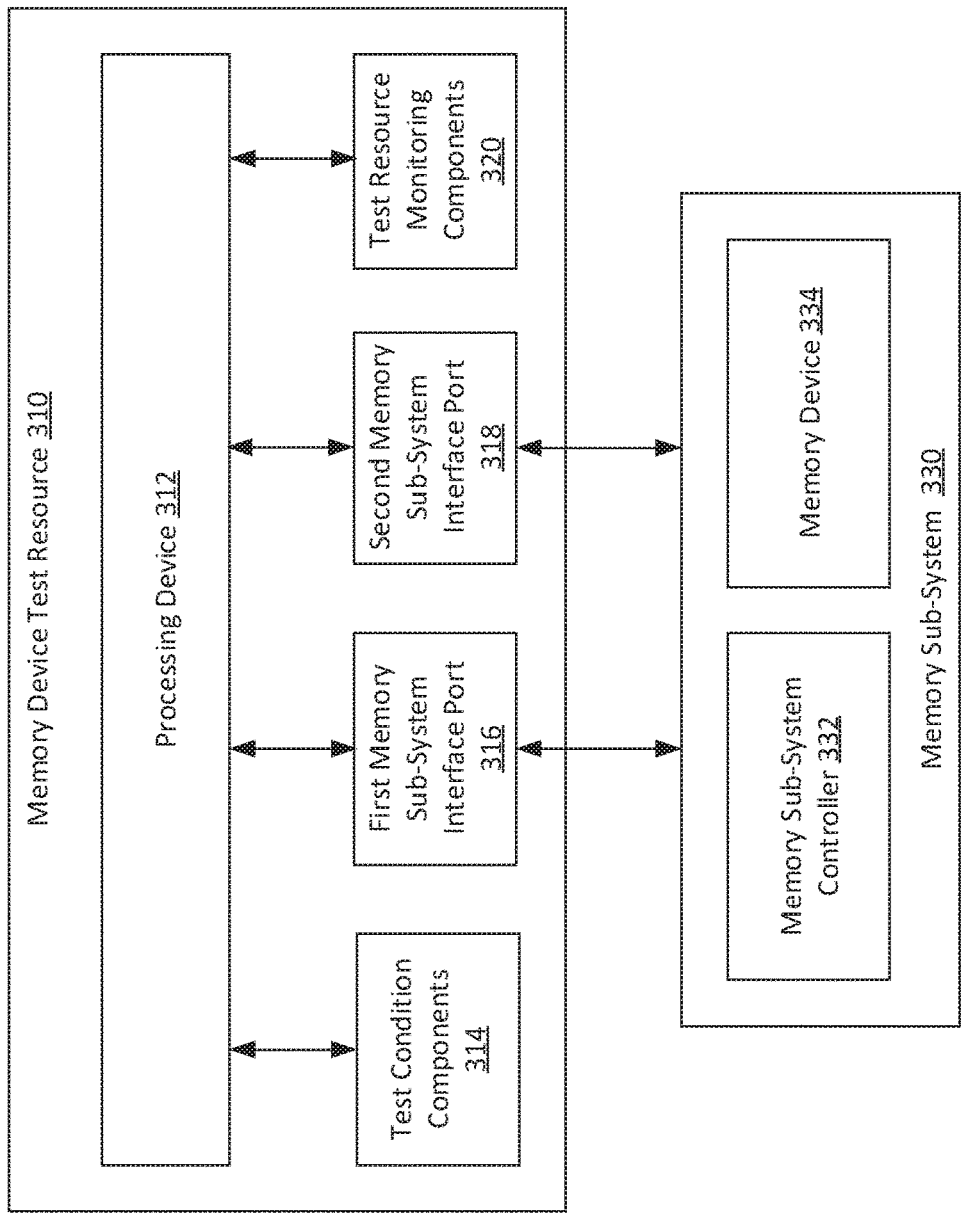
FIG. 3 is an example memory device test resource in accordance with some embodiments of the present disclosure.

FIG. 3 is an example memory device test resource 310, in accordance with some embodiments of the present disclosure. For example, memory device test resource 310 can be one implementation of any of the memory device test resources 214 illustrated in FIG. 2. The test resource 310 can include a processing device 312, one or more test conditions components 314, a first memory sub-system interface port 316 (referred to herein as first port 316), a second memory sub-system interface port 318 (referred to herein as second port 318), and one or more test resource monitoring components 320.

As described previously, processing device 312 can facilitate testing of a memory device 334 of a memory sub-system 330 embedded within test resource 310. Processing device 312 can receive one or more test instructions to be executed in the performance of a test of memory device 334. The one or more test instructions can include one or more operations to be performed at the memory device 334. In some embodiments, the one or more test instructions can further include one or more conditions to be applied to memory sub-system 330 during performance of the test.

Memory sub-system 330 can be coupled to test resource 310 by engaging with first port 316 and second port 318. First port 316 can include one or more pins configured to facilitate a peripheral component interconnect express (PCIe) protocol and/or a serial AT attachment (SATA) protocol. In other or similar embodiments, first port 316 can include one or more non-serial input/output (IO) pins. In some embodiments, the non-serial IO port can be a customer interface port. Second port 318 can be a serial input/output (IO) port including one or more serial input/output (IO) pins configured to couple to corresponding serial IO receptacles of the memory sub-system. In other or similar embodiments, second port 318 can include one or more pins configured to facilitate a universal asynchronous receiver/transmitter (UART) protocol, a system management bus (SMB) protocol, or a serial wire debug (SWD) protocol. Further details regarding the first port 316 and the second port 318 are further described with respect to FIG. 4. In some embodiments, memory sub-system 330 can be coupled to test resource 310 by engaging with additional ports, such as a third port, etc.

In response to detecting that memory sub-system 330 has coupled to first port 316 and second port 318, processing device 312 can cause a power supply signal to be provided to memory sub-system 330 via first port 316 at a first voltage condition. In some embodiments, the power supply signal can include electricity. Processing device 312 can further transmit one or more test instructions, including one or more operations to be performed at memory device 334, to memory sub-system 330 via the second port 318.

In some embodiments, processing device 312 can cause memory sub-system 330 to initiate a re-boot process prior to the test being performed at memory device 334. In such embodiments, processing device can transmit a signal to memory sub-system controller 332, via second port 318, instructing memory sub-system controller 332 to initiate the re-boot process. Memory sub-system controller 332, in response to receiving the signal, can initiate the re-boot process. Memory sub-system controller 332 can initiate the test after initiating the re-boot process. In other or similar embodiments, processing device 312 does not transmit a signal to memory sub-system controller 332 to initiate the re-boot process and instead can transmit a signal to memory sub-system controller 332, via second port 318, instructing memory sub-system controller 332 to initiate the test at memory device 334. Memory sub-system controller 332 can initiate the test at memory device 334 in response to receiving the signal from processing device 312, via second port 318.

Prior to the initiation of the test at memory device 334, processing device 312 can cause one or more conditions of test resource 310 to be applied to memory sub-system 330. In some embodiments, processing device 312 can cause the one or more conditions to be applied in accordance with the one or more test instructions received from a resource allocator, such as resource allocator 222 of FIG. 2. Test condition components 314 can generate the one or more conditions. In some embodiments, a test condition component 314 can include at least one of a temperature controller or a voltage controller. Test conditions components 314 can cause the one or more conditions to be applied to memory sub-system 330 according to the one or more conditions of the received test instructions. In some embodiments, the one or more test instructions can include at least a second condition to be applied to memory sub-system 330 during performance of the test at memory device 334. Test condition components 314 can cause a first condition to be changed to a second condition during testing of memory device 334.

Test resource monitoring components 320 can monitor one or more conditions within test resource 310. In some embodiments, test resource monitoring components 320 can monitor a condition generated by a test condition component 314. For example, a temperature monitoring component can measure a temperature of test resource 310, where the temperature is generated by a temperature controller of test resource 310. Test resource monitoring components 320 can include at least one of a temperature monitoring component configured to monitor a temperature of test resource 310, a voltage monitoring component configured to monitor a voltage of a power supply signal provided to memory sub-system 330 via second port 318, a current monitoring component configured to monitor a current of the power supply signal provided to memory sub-system 330 via second port 318, or a humidity monitoring component configured to monitor a humidity of test resource 310.

As described previously, memory sub-system controller 332 can receive one or more test instructions including one or more operations to be performed at memory device 334 from processing device 312. In response to receiving an instruction from processing device 312 to initiate the test at memory device 334, memory sub-system controller 332 can cause one or more operations of the received test instructions to be performed at memory device 334. Memory sub-system controller 332 can generate one or more sets of test results associated with the performance of the one or more operations at memory device 334. Memory sub-system controller 332 can generate at a first set of test results, in accordance with previously described embodiments.

In some embodiments, memory sub-system controller 332 can generate at least a second set of test results. As the one or more operations are performed at memory device 334, memory sub-system controller 332 can detect a change from a first condition to a second condition, where a test condition component 314 caused the change from the first condition to the second condition, in accordance with previously described embodiments. In some embodiments, memory sub-system controller 332 can detect the change in response to receiving a signal from processing device 312. In other or similar embodiments, memory sub-system controller 332 can detect the change in response to receiving a signal from a sensor of memory sub-system 330 that a condition of memory sub-system 330 has changed from the first condition to the second condition. In response to detecting the change from the first condition to the second condition, memory sub-system controller 332 can generate a second set of test results. The second set of test results can correspond to a performance of one or more operations of the test instructions at the second condition.

In response to completion of the test at memory device 334, memory sub-system controller 332 can transmit one or more sets of test results to processing device 312. In response to receiving the one or more sets of test results, processing device 312 can transmit each set of test results to another computing device, such as server 220 of FIG. 2, for transmission and/or presentation to a user requesting the test for memory device 334.

In some embodiments, processing device 312 can include a memory component (not shown) that is configured to store data associated with one or more conditions of the test resource 310 during the performance of the test at memory device 334. In such embodiments, processing device 312 can transmit, along with each set of test results, data associated with the one or more conditions of test resource 310 during the performance of the test for memory device 334.

Figure 4:
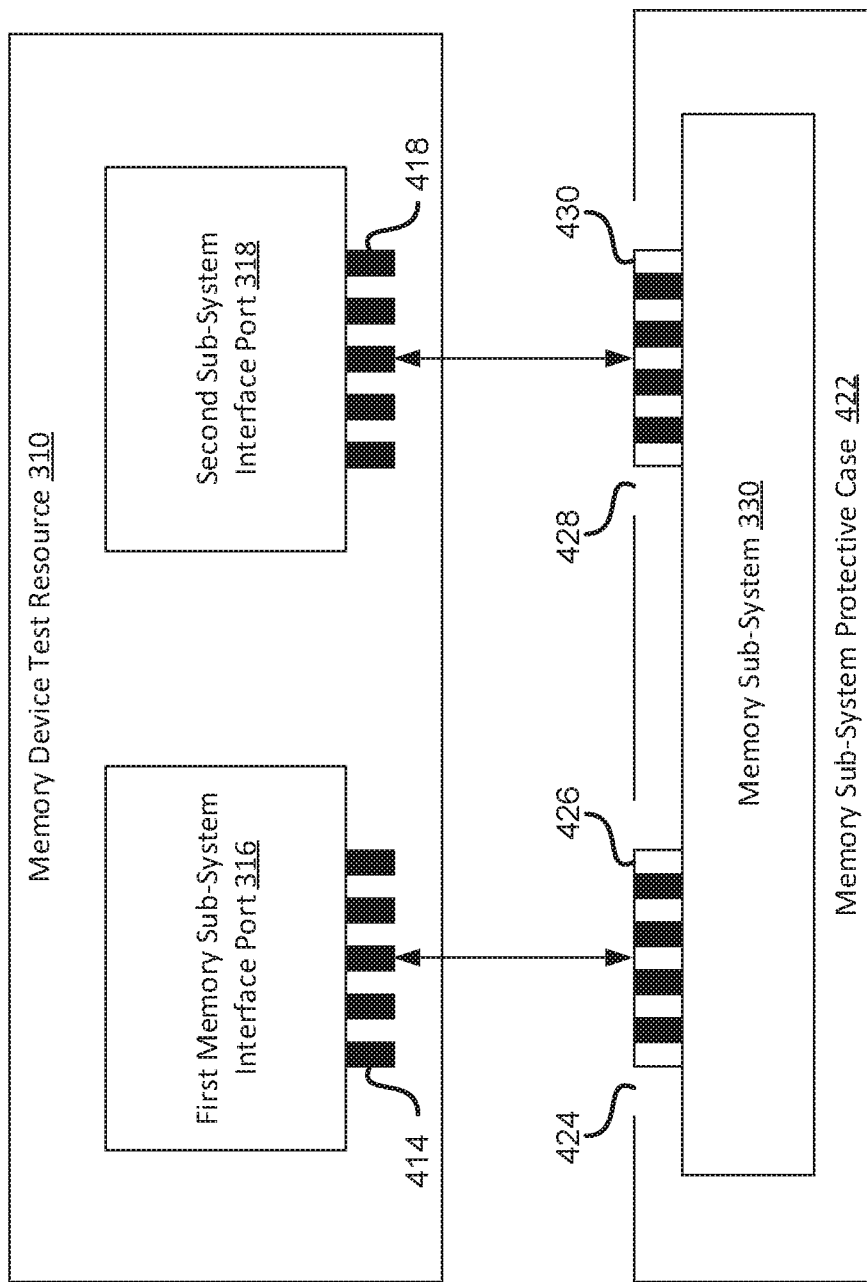
FIG. 4 is an example connection of a memory sub-system to a memory device test resource via a first memory sub-system interface port and a second memory sub-system interface port, in accordance with some embodiments of the present disclosure.

FIG. 4 is an example connection of a memory device test resource 310 to a memory sub-system 330 via a first port 316 and a second port 318, in accordance with some embodiments of the present disclosure. First port 316 can be configured to transmit a power supply signal to memory sub-system 330 from test resource 310. First port 316 can include a first set of pins 414 that are configured to couple to a first set receptacles 426 of memory sub-system 330. The first set of receptacles 426 can be configured to receive the power supply signal from test resource 310 transmitted via first port 316. In some embodiments, the first set of pins 414 can be pins of a high speed serial interface. For example, each of the first set of pins 412 can be configured to facilitate a PCIe protocol or a SATA protocol. In some embodiments, memory sub-system 330 can be enclosed in a protective case 422. The protective case 422 can have a first opening 424 to expose the first set of receptacles 426 to the first set of pins 414 of test resource 310. The first set of pins of the test resource 310 can be configured to connect to the first set of receptacles of the memory sub-system 330 via the first opening 424 of the protective case 422.

Second port 318 can be a serial input/output (IO) port that is configured to transmit data to memory sub-system 330. Second port 318 can include a second set of pins 418. In some embodiments, each of the second set of pins 418 can be serial IO pins. In other or similar embodiments, each of the second set of pins 418 can be pins of a low speed serial interface. For example, each of the second set of pins 418 can be configured to facilitate a UART protocol, a SMB protocol, or a SWD protocol. Memory sub-system 330 some can include a second set of receptacles 430. In some embodiments, each of the second set of receptacles 430 can be serial IO receptacles. The second set of receptacles 430 can be configured to receive data from and/or transmit data to test resource 310. In some embodiments, protective case 422 can include a second opening 428 to expose the second set of receptacles 430 second set of pins 418 of second port 416. The second set of pins 418 can be configured to couple to the second set of receptacles 430 via the second opening 428 of protective case 422.

Figure 5:
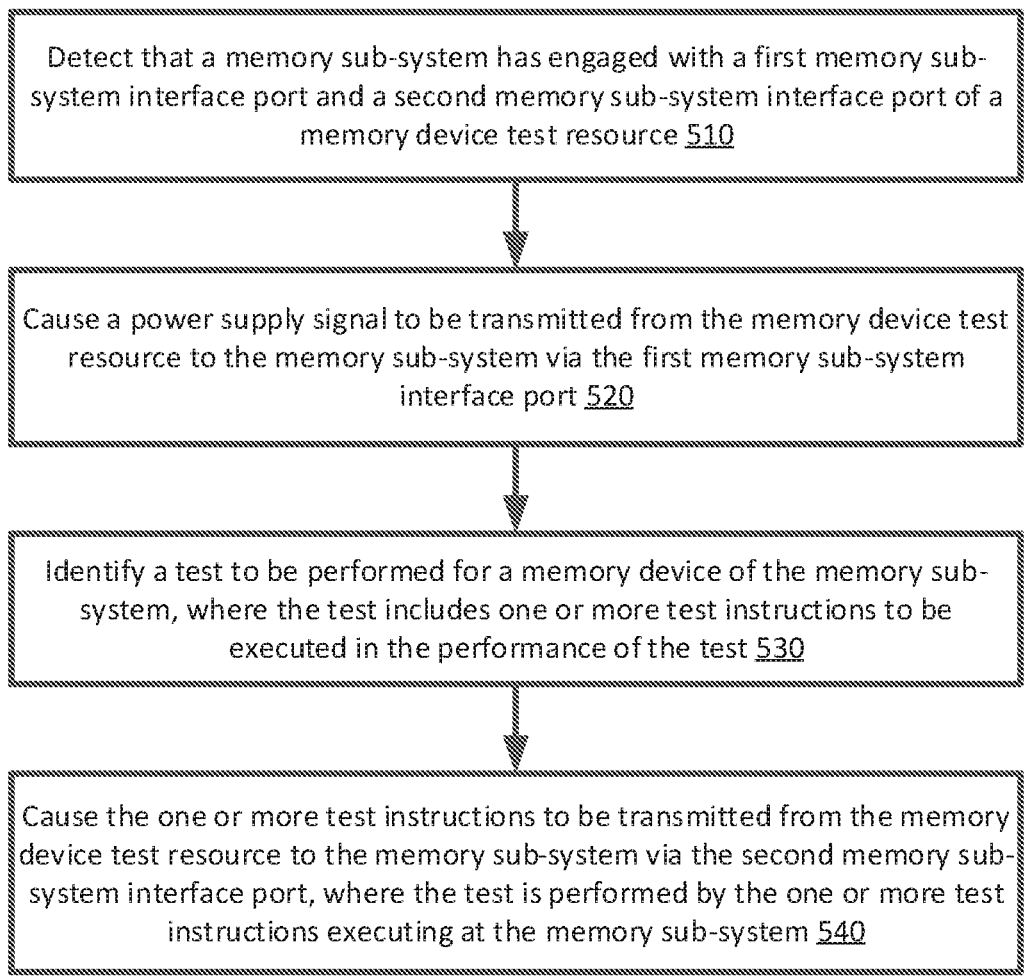
FIG. 5 is a flow diagram of an example method to transmit data and power from a memory device test resource to a memory sub-system, in accordance with some embodiments of the present disclosure.

FIG. 5 is a flow diagram of an example method 500 to transmit data and power from a memory device test resource to a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by a processing device 312 of a memory device test resource 310 of FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device 312 detects that a memory sub-system has engaged with a first memory sub-system interface port and a second memory sub-system interface port of a memory device test resource, referred to as a test resource. For example, the memory sub-system may be memory sub-system 330 of FIG. 3. The first memory sub-system interface port, such as first port 316, can be a non-serial input/output (IO) port including one or more pins, such as the first set of pins 414 of FIG. 4, configured to couple to corresponding receptacles, such as the first set of receptacles 426, of the memory sub-system 330. In some embodiments, the first port 316 can be a customer interface port. The one or more pins of the first set of pins 414 can be configured to transmit power from the memory device test resource 310 to the memory sub-system 330 engaged with the test resource. The second memory sub-system interface port, such as second port 318, can be a serial IO port. The serial IO port can include one or more serial IO pins, such as the second set of pins 418, configured to couple to corresponding serial IO receptacles, such as the second set of receptacles 430, of the memory sub-system 330. The one or more serial IO pins of the second set of pins 418 can be configured to transmit data between the test resource 310 and the memory sub-system 330 engaged with the test resource 310.

In some embodiments, the memory sub-system 330 can be enclosed within a protective case, such as memory sub-system protective case 422. The protective case 422 can include a second opening 428 configured to expose the corresponding serial IO receptacles of the memory sub-system 330 to the serial IO pins of the second memory sub-system interface port. The second port 318 can be configured to couple to the memory sub-system 330 via the second opening 428 of the protective case 422.

At operation 520, the processing device 312 causes a power supply signal to be transmitted from the test resource 310 to the memory sub-system 330 via the first port 316. In some embodiments, the power supply signal can include electricity. The power supply signal can be transmitted to the memory sub-system 330 at a first voltage. In some embodiments, a voltage controller of the test resource 310 can cause the power supply signal to be transmitted at the first voltage.

At operation 530, the processing device 312 identifies a test to be performed for a memory device, such as memory device 334, of memory sub-system 330, where the test includes one or more test instructions to be executed during the performance of the test. The memory sub-system 330 can include a memory sub-system controller, such as memory sub-system controller 332. The memory sub-system controller 332 can be responsible for performing the test for the memory device 334. In some embodiments, the one or more test instructions include one or more operations to be performed at the memory device 334, such as a read operation, a write operation, and/or an erase operation. The test instructions can further include conditions at which the test is to be performed under, referred to as a test condition. For example, the test instructions can include one or more temperature conditions and/or one or more voltage conditions to be applied to the memory sub-system 330 during the performance of the test.

Each test condition can be generated by a test condition component 314 of the test resource. For example, the memory sub-system 330 can be subjected to a temperature condition by a temperature controller. In some embodiments, the temperature controller can include one or more fans configured to cool ambient air surrounding the memory sub-system embedded within the test resource. In other or similar embodiments, the temperature controller can be a dual Peltier device (e.g., two Peltier devices) that utilize a Peltier effect to apply a heating or cooling effect at a surface of the dual politer device that is coupled to the memory sub-system. In another example, a voltage condition can be applied to the memory sub-system 330 by a voltage controller. In some embodiments, the voltage controller can include one or more power supplies configured to supply different voltages to the memory sub-system via the first memory sub-system interface port.

Test conditions can be monitored by one or more test resource monitoring components, such as test resource monitoring components 320, of the test resource 310. For example, a temperature monitoring component can monitor a temperature of the memory sub-system 330 during testing. In another example, a voltage monitoring component can monitor a voltage supplied to the memory sub-system 330 via the first port 316. A test resource monitoring component 320 can also include a current monitoring component configured to monitor a current of power supplied to the memory sub-system via the first sub-system interface port. In other or similar embodiments, a test resource monitoring component 320 can include a humidity monitoring component configured to monitor a humidity of ambient air surrounding the memory sub-system during testing.

At operation 540, the processing device 312 causes the one or more test instructions to be transmitted from the test resource 310 to the memory sub-system 330 via the second port 318, where the test is performed by the one or more test instructions executing at the memory sub-system 330. The memory sub-system controller 332 of the memory sub-system 330 can receive the one or more test instructions and cause one or more operations of the test to be performed at the memory device 334. In some embodiments, the processing device 312 causes the operations to be performed at the memory device 334 by transmitting a signal to the memory sub-system controller 332 via the second port 318 to initiate performance of the operations at the memory device 334. In other or similar embodiments, the processing device 312 causes the operations to be performed at the memory device 334 by transmitting a signal to cause the memory sub-system controller 332 to initiate a re-boot process. The one or more operations can be performed in response to the memory sub-system 330 initiating the re-boot process.

The processing device 312 can receive, via the second port 318, one or more sets of test results associated with the performance of the one or more operations at the memory device 334. Each set of test results can include at least one of performance characteristics or behaviors of the memory device 334 while the test process is performed. The performance characteristics and/or the behaviors of the memory device 334 can be observed by the memory sub-system controller 32 while the one or more operations are being performed. In response to receiving the one or more sets of test results, the processing device 312 can transmit the test results to a server associated with a customer that requested the test of the memory device, such as server 220 of FIG. 2. In some embodiments, the processing device 312 can transmit, with the test results, data associated with one or more conditions monitored by a test resource monitoring component 320 of the test resource. For example, the processing device 312 can transmit data associated with at least one of a temperature of the test resource 310, a humidity of the test resource 310, a voltage of a power supply signal supplied to the memory sub-system 330, or a current of the power supply signal supplied to the memory sub-system 330 during testing of the memory device 334.

Figure 6:
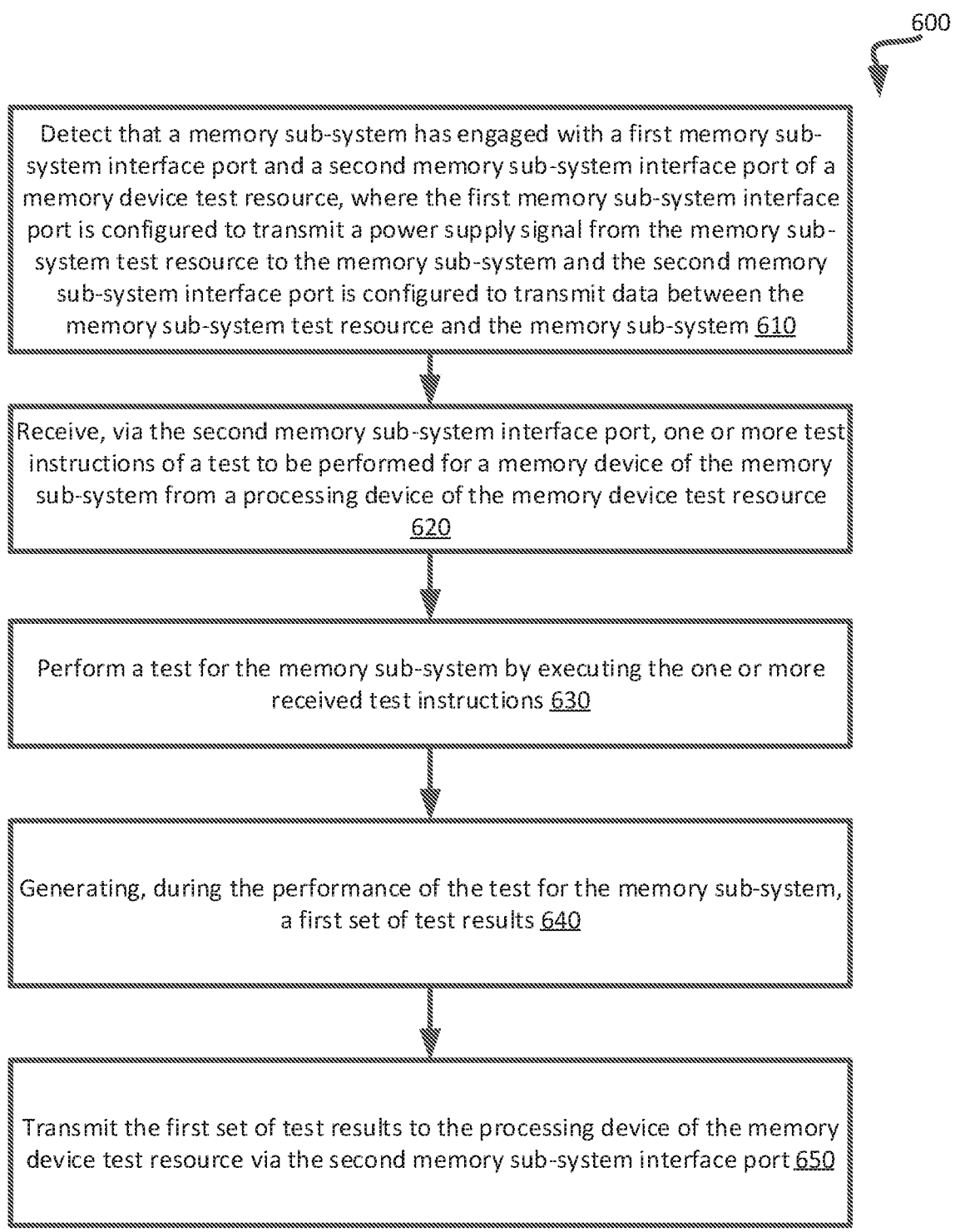
FIG. 6 is a flow diagram of an example method of receiving data and power from a memory device test resource by a memory sub-system, in accordance with some embodiments of the present disclosure.

FIG. 6 is a flow diagram of an example method 600 of receiving data and power from a memory device test resource by a memory sub-system, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the testing component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, the testing component 113 detects that a memory sub-system, such as memory sub-system 330 of FIG. 3, has engaged with a first memory sub-system interface port, such as first port 316, and a second memory sub-system interface port, such as second port 318, of a memory device test resource, such as memory device test resource 310, where the first port 316 is configured to transmit power from the test resource 310 to the memory sub-system 330 and the second port 318 is configured to transmit data between the test resource 310 and the memory sub-system 330. The first port 316 can be a non-serial IO port, such as a customer interface port, and the second port 318 can be a serial IO port, in accordance with previously described embodiments. In some embodiments, the second port 318 can be configured to couple to the memory sub-system 330 via an opening of a protective case, such as second opening 428 of memory sub-system protective case 422, of the memory sub-system 330, in accordance with previously disclosed embodiments.

At operation 620, the testing component 113 receives, via the second port 318, one or more test instructions of a test to be performed for a memory device, such as memory device 334, of the memory sub-system 330 from a processing device, such as processing device 312, of the test resource 310. The one or more test instructions can include operations to be performed at the memory device 334, in accordance with previously disclosed embodiments. The memory sub-system 330 can cause each operation of the one or more test instructions to be performed at the memory device 334. In some embodiments, the memory sub-system 330 can cause each operation to be performed under various test conditions, temperature conditions or voltage conditions. The temperature conditions and/or the voltage conditions can be applied to the memory sub-system 330 by a test condition component, such as test condition component 314, of the test resource 310, in accordance with previously described embodiments.

At operation 630, the testing component 113 performs a test for the memory device 334 by executing the one or more received test instructions. As previously described, a memory sub-system controller, such as memory sub-system controller 332, can perform the test by causing the performance of the one or more operations of the received test instructions. In some embodiments, the memory sub-system controller 332 can perform the test at the memory device 334 in response to receiving, via the second port 318, a signal from the processing device 312 to initiate testing of the memory device 334. In other or similar embodiments, the memory sub-system controller 332 can perform the test in response to initiating a re-boot process. The memory sub-system controller 332 can initiate the re-boot process in response to receiving a signal from the processing device 312, in accordance with previously described embodiments.

At operation 640, the testing component 113 generates, during the performance of the test, a first set of test results. As previously described, the one or more test instructions for the test can include conditions at which the memory sub-system 330 is to perform the test for the memory device under. In some embodiments, the conditions can include at least a first test condition, such as a first temperature condition and/or a first voltage condition. The first set of test results can correspond to a performance of the test under the first test condition. The memory sub-system controller 332 can generate a second set of test results corresponding to a performance of one or more operations of the test instructions at the second condition.

At operation 650, the testing component 113 transmits the first set of test results to the processing device 312 via the second port 318. In some embodiments, the processing device 312 further transmits the second set of test results generated based on the performance of one or more operations at the second condition, in accordance with previously described embodiments. In response to receiving the first set of test results and/or the second set of test results, the processing device 312 can cause the received test results to be transmitted to a server, such as server 220 of FIG. 2, in accordance with previously described embodiments.

Figure 7:
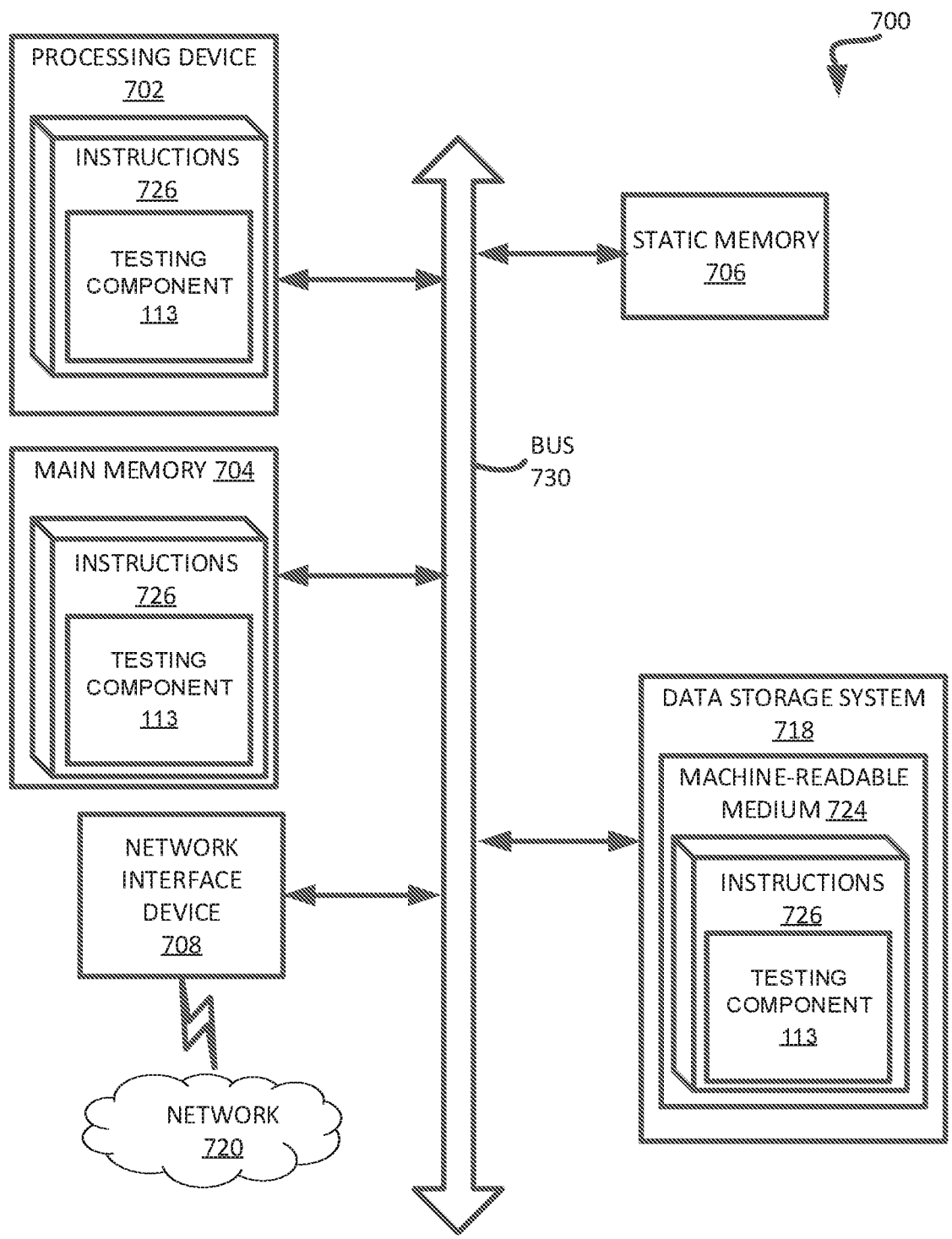
FIG. 7 is a block diagram of an example computer system, in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the testing component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a testing component (e.g., the testing component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    detecting, by a processing device of a memory device test resource, that a memory sub-system has engaged with a first memory sub-system interface port and a second memory sub-system interface port of the memory device test resource, wherein the memory sub-system comprises a memory sub-system controller and one or more memory devices coupled to the memory sub-system controller;
    causing, by the processing device, a power supply signal at a voltage condition to be transmitted from a voltage controller of the memory device test resource to the memory sub-system via the first memory sub-system interface port;
    identifying, by the processing device, a test to be performed for the one or more memory devices of the memory sub-system while subjected to the voltage condition and a temperature condition established by a temperature controller of the memory device test resource, wherein the test comprises one or more test instructions associated with one or more operations to be executed by the memory sub-system controller in performance of the test;
    causing, by the processing device, the one or more test instructions to be transmitted from the memory device test resource to the memory sub-system via the second memory sub-system interface port, wherein the test is performed by the memory sub-system controller executing the one or more test instructions at the memory sub-system while subjected to the voltage condition and the temperature condition;
    causing, by the processing device, a voltage monitoring component of the memory device test resource to monitor the voltage condition during execution of the one or more test instructions; and
    causing, by the processing device, a temperature monitoring component of the memory device test resource to monitor the temperature condition during execution of the one or more test instructions.

2. The method of claim 1, wherein the first memory sub-system interface port comprises one or more pins configured to couple to corresponding receptacles of the memory sub-system, wherein the one or more pins are configured to transmit the power supply signal from the memory device test resource to the memory sub-system engaged with the memory device test resource.

3. The method claim 1, wherein the second memory sub-system interface port comprises one or more serial input/output (IO) pins configured to couple to corresponding serial IO receptacles of the memory sub-system.

4. The method of claim 3, wherein the second memory sub-system interface port is configured to couple to the memory sub-system via an opening of a protective case of the memory sub-system that is configured to expose the corresponding serial IO receptacles of the memory sub-system to the serial IO pins of the second memory sub-system interface port.

5. The method of claim 1, further comprising:
    receiving, via the second memory sub-system interface port, results from the test performed at the one or more memory devices.

6. The method of claim 1, further comprising:
    causing, by the processing device, the voltage controller of the memory device test resource to generate the voltage condition to be applied to the memory sub-system based on the one or more test instructions for the test to be performed for the one or more memory devices; and
    receiving, from the voltage controller, data associated with the voltage condition.

7. The method of claim 6, further comprising:
    causing, by the processing device, the temperature controller to generate the voltage condition to be applied to the memory sub-system while the test is performed at the one or more memory devices.

8. The method of claim 6, wherein the memory device test resource further comprises at least one of a current monitoring component or a humidity monitoring component.

9. A memory sub-system, comprising:
    a memory device; and
    a processing device operatively coupled to the memory device, the processing device to:
        detect that the memory sub-system has engaged with a first memory sub-system interface port and a second memory sub-system interface port of a memory device test resource, wherein the first memory sub-system interface port is configured to transmit a power supply signal at a voltage condition from a voltage controller of the memory device test resource to the memory sub-system and the second memory sub-system interface port is configured to transmit data between the memory device test resource and the memory sub-system;
        receive, via the second memory sub-system interface port and from a processing device of the memory device test resource, one or more test instructions of a test to be performed for the memory device while subjected to the voltage condition and a temperature condition established by a temperature controller of the memory device test resource;
        perform the test for the memory device by executing the one or more test instructions associated with one or more operations to be executed by the memory device;

generate, during the performance of the test for the memory device, a first set of test results; and transmit the first set of test results to the processing device of the memory device test resource via the second memory sub-system interface port.

10. The memory sub-system of claim 9, wherein the first memory sub-system interface port comprises one or more receptacles configured to couple to corresponding pins of the first memory sub-system interface port.

11. The memory sub-system of claim 9, wherein the second memory sub-system interface port is a serial input/output (IO) port, and wherein the memory sub-system comprises one or more serial IO receptacles configured to couple to corresponding serial IO pins of the serial IO port.

12. The memory sub-system of claim 11, wherein the memory sub-system comprises a protective case surrounding one or more portions of an exterior of the memory sub-system, and wherein the protective case comprises an opening configured to expose the one or more serial IO receptacles to the corresponding serial IO pins of the serial IO port.

13. The memory sub-system of claim 9, wherein the first set of test results is generated based on the voltage condition applied to the memory sub-system, and wherein the processing device is further to:

responsive to the processing device generating the temperature condition while the test is performed at the memory device, generating a second set of test results; and transmitting the second set of test results to the processing device of the memory device test resource via the second memory sub-system interface port.

14. A test rack comprising a plurality of test boards, wherein each of the plurality of test boards comprises a plurality of memory device test resources, and wherein a processing device of each of the plurality of memory device test resources is to perform operations comprising:

detecting that a memory sub-system has engaged with a first memory sub-system interface port and a second memory sub-system interface port of a memory device test resource, wherein the memory sub-system comprises a memory sub-system controller and one or more memory devices coupled to the memory sub-system controller;

causing a power supply signal at a voltage condition to be transmitted from a voltage controller of the memory device test resource to the memory sub-system via the first memory sub-system interface port;

identifying a test to be performed for the one or more memory devices of the memory sub-system while subjected to the voltage condition and a temperature condition established by a temperature controller of the memory device test resource, wherein the test comprises one or more test instructions associated with one or more operations to be executed by the memory sub-system controller in performance of the test;

causing the one or more test instructions to be transmitted from the memory device test resource to the memory sub-system via the second memory sub-system interface port, wherein the test is performed by the memory sub-system controller executing the one or more test instructions at the memory sub-system while subjected to the voltage condition and the temperature condition;

causing a voltage monitoring component of the memory device test resource to monitor the voltage condition during execution of the one or more test instructions; and causing a temperature monitoring component of the memory device test resource to monitor the temperature condition during execution of the one or more test instructions.

15. The test rack of claim 14, wherein the first memory sub-system interface port comprises one or more pins configured to couple to corresponding receptacles of the memory sub-system, wherein the one or more pins are configured to transmit the power supply signal from the memory device test resource to the memory sub-system engaged with the memory device test resource.

16. The test rack of claim 14, wherein the second memory sub-system interface port comprises one or more serial input/output (IO) pins configured to couple to corresponding serial IO receptacles of the memory sub-system.

17. The test rack of claim 16, wherein the second memory sub-system interface port is configured to couple to the memory sub-system via an opening of a protective case of the memory sub-system that is configured to expose the corresponding serial IO receptacles of the memory sub-system to the serial IO pins of the second memory sub-system interface port.

18. The test rack of claim 14, wherein the processing device to perform operations further comprising:

receiving, via the second memory sub-system interface port, results from the test performed at the memory device.

19. The test rack of claim 14, wherein the processing device to perform operations further comprising:

causing the voltage controller of the memory device test resource to generate the voltage condition to be applied to the memory sub-system based on the one or more test instructions for the test to be performed for the memory device; and receiving, from the voltage controller, data associated with the voltage condition.

* * * * *